United States Patent [19]

Sato

[11] Patent Number: 5,688,364
[45] Date of Patent: Nov. 18, 1997

[54] CHEMICAL-MECHANICAL POLISHING METHOD AND APPARATUS USING ULTRASOUND APPLIED TO THE CARRIER AND PLATEN

[75] Inventor: Junichi Sato, Tokyo, Japan

[73] Assignee: Sony Corporation, Tokyo, Japan

[21] Appl. No.: 575,139

[22] Filed: Dec. 19, 1995

[30] Foreign Application Priority Data

Dec. 22, 1994 [JP] Japan .................................. 6-320713

[51] Int. Cl.[6] .................................................. H01L 21/306
[52] U.S. Cl. ................... 156/636.1; 156/345; 156/645.1; 216/88; 451/165; 451/287
[58] Field of Search ........................... 156/636.1, 645.1, 156/345; 216/88, 89; 451/287, 165, 910

[56] References Cited

U.S. PATENT DOCUMENTS

| 5,101,599 | 4/1992 | Takabayasi et al. ................ 451/910 |
| 5,232,875 | 8/1993 | Tuttle et al. ......................... 437/225 |
| 5,245,790 | 9/1993 | Jerbic ................................... 51/121 |
| 5,245,796 | 9/1993 | Miller et al. ........................ 51/283 R |
| 5,486,265 | 1/1996 | Salugsugan ............................ 216/88 |
| 5,522,965 | 6/1996 | Chisholm et al. ................. 156/636.1 |
| 5,531,861 | 7/1996 | Yu et al. ................................ 216/89 |

Primary Examiner—R. Bruce Breneman
Assistant Examiner—Anita Alanko
Attorney, Agent, or Firm—Hill, Steadman & Simpson

[57] ABSTRACT

There is provided a chemical-mechanical polishing method and apparatus ensuring excellent polishing rate and flattening characteristics for flattening level different areas on interlayer insulating film generated in the manufacturing process of a semiconductor device. Polishing is performed while ultrasonic wave vibration is being applied to a processing substrate. The ultrasonic wave vibration applying means are mounted on the carrier and platen. Thereby, since polishing is performed while using the ultrasonic wave energy in addition to the conventional chemical-mechanical polishing method, polishing rate can be much improved. Moreover, since the slurry is supplied sufficiently without relation to pattern density and areas of the level different areas, uniform and flat surface not depending on the pattern can be obtained.

11 Claims, 4 Drawing Sheets

FIG. IA
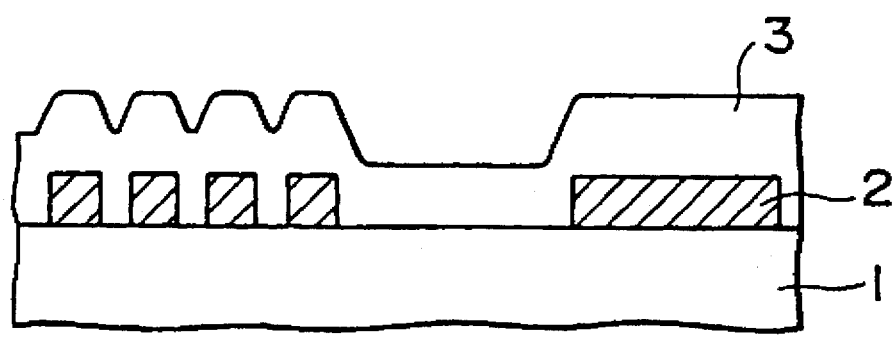
FIG. IB
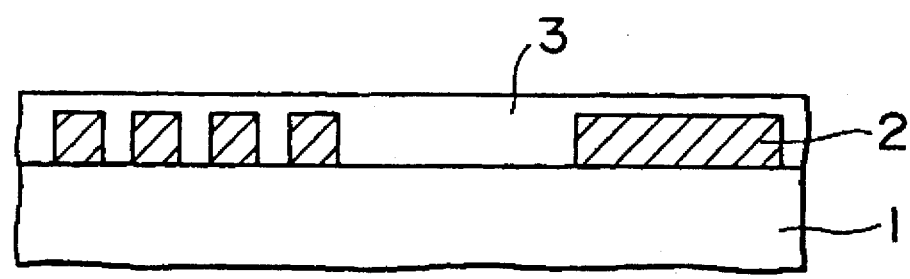

CHEMICAL-MECHANICAL POLISHING METHOD AND APPARATUS USING ULTRASOUND APPLIED TO THE CARRIER AND PLATEN

BACKGROUND OF THE INVENTION

1. Field of the Invention

The present invention relates to a chemical-mechanical polishing method and apparatus and more specifically to a chemical-mechanical polishing method and apparatus which is suitable for global flattening of level different areas of an interlayer insulating film or an electrode wiring on a substrate as a processing object generated during the manufacturing processes, for example, of a semiconductor device.

2. Description of Related Art

With rapid progress of integration density of a semiconductor device such as LSI, etc. resulting in further ultra microminiaturization of design rule to quarter micron level from subhalf micron level, pattern width of internal wirings is also more reduced. Meanwhile, in order to keep wiring resistance in a lower level to prevent delay of signal propagation and various migrations, it is a must to secure the cross-sectional area of wiring. That is, since height of the wiring cannot be reduced sufficiently, an aspect ratio of the wiring tends to be increased.

In the case of forming a multilayer wiring structure using such quarter micron level wiring as a lower layer, it is required to repeat the processes of securing the flat surface by forming a flat interlayer insulating film to fill the level different areas or recessed areas formed by a lower layer wiring and forming thereon an upper layer wiring. It is important from the viewpoints not only from prevention of disconnection of the upper layer wiring but also from compensation for drop of focal depth derived from short wavelength of an exposing light beam and high NA of lens in the lithography required for resist patterning. As an example, level or surface height difference of 0.3 to 0.4 µm or less at the exposing surface is required for patterning with good controllability of the line and space of the 0.3 µm rule with the KrF excimer laser stepper exposure in the wavelength of 248 nm.

A variety of methods have been proposed to form a flattened interlayer insulating film. For example, general description of these forming methods is inserted, for example, on pages 74 to 95 of the Semiconductor World, Nov. 1989 (issued by Press Journal). These methods can be classified into two kinds of category of improving the self-flow characteristic by optimization of the film forming conditions or improving the shape of reflow by heat treatment after the formation of film. Any one of these methods is further required to realize improvement in the shape of flattening of interlayer insulating film at the level different area or recessed area of the wider wiring interval or in prevention of voids of interlayer insulating film at the area of the narrower wiring interval.

Meanwhile, a global flattening method based on the chemical-mechanical polishing (CMP) utilizing a mirror polishing method of silicon wafer has been proposed recently. This chemical-mechanical polishing method is expected as a promising method to surely flatten the level different areas formed on a substrate as the processing object.

FIG. 4 is a schematic cross-sectional view illustrating the chemical-mechanical polishing apparatus of the related art. In FIG. 4, a processing substrate 11 is adhesively bonded to the downwardly facing polishing surface of a rotating carrier 12. The carrier 12 is disposed above an opposite to a rotatable platen 13 which is provided as the rotatable polishing plate.

Slurry 17 is supplied to a polishing cloth called a pad 14 on the platen via a nozzle 16 from a slurry supply system 15 and the polishing is carried out while the processing substrate 11 is pressed to the pad 14 under the predetermined pressure. In this case, it is a key point that the number of rotations of carrier 12 and platen 13 and adjustment of rotating shaft are optimized and how to select the slurry having a grain size for the polishing and a pH value just suitable for the processing substrate. As an example, in the case of polishing an interlayer insulating film of silicon oxide system, the so-called CMP (chemical-mechanical polishing) combining the chemical reaction utilizing the KOH aqueous solution in which fine particle of silica is suspended and the mechanical polishing is performed.

However, the flattening method based on the chemical-mechanical polishing method still has several problems to be solved for the practical use. One of such problems is that polishing rate for the flattening is rather lower and therefore 10 minutes or longer is usually required for polishing of a sheet of the substrate to be processed. Since an insulating film of the silicon oxide system deposited in a large thickness including the level different areas of the wiring layer of the lower layer is polished in the flattening process of the interlayer insulating film, improvement of throughput due to increase of the polishing rate is a very important problem.

Moreover, dependence on pattern of the polishing rate may also be considered as another problem. Namely, difference may sometimes be generated between the polishing rate of the small projected area and that of the large projected area. On the occasion of flattening an interlayer insulating film, the polishing rate of the large projected area becomes small, resulting in deteriorated controllability for flattening of this area.

In view of solving these problems, the specification of the U.S. Pat. No. 4,954,459 discloses the method that a part in the thickness direction of the interlayer insulating film at the projected area is previously removed by the isotropic etching method using the resist pattern as a mask and thereafter the chemical-mechanical polishing is performed thereto. This method will be explained in more detail with reference to FIG. 3.

A plurality of wiring layers 2 in different line widths are patterned on a first interlayer insulating film 1 formed on a semiconductor substrate not illustrated, and a second interlayer insulating film 3 is then formed thereon. Since the second interlayer insulating film 3 includes wider projected areas and narrower projected areas, if polishing is executed under this condition, the polishing rate at the wider projected areas becomes particularly small, not realizing satisfactory global flattening. Therefore, as shown in FIG. 3A, resist patterns 4 are formed at the recessed areas and a part in the thickness direction of the interlayer insulating film at the projected area is removed as shown in FIG. 3B. When the resist patterns are removed, the second interlayer insulating film leaves only fine projected areas as shown in FIG. 3C. Since the fine projected areas have almost equal volumes, when the polishing is started from this condition of FIG. 3C, the polishing time can be reduced and the flattening showing excellent shape of surface can be realized as shown in FIG. 3D.

According to this related art, flattening not depending on wiring pattern of the under layer may be realized but a problem that the throughput of the flattening process as a whole is reduced is newly generated because formation of resist pattern is necessary and additional processes such as etching and removal of resist pattern are required.

SUMMARY OF THE INVENTION

It is therefore an object of the present invention to provide a chemical-mechanical polishing method and a chemical-mechanical polishing apparatus which ensures a polishing rate which is higher than that of the related art and excellent flattening shape not depending on pattern.

The chemical-mechanical polishing method of the present invention has been proposed to overcome the problems described above and is characterized by executing the chemical-mechanical polishing while the ultrasonic wave is applied to the substrate to be processed in the chemical-mechanical polishing method comprising the process for flattening the surface of the processing substrate including the level different areas. During the chemical-mechanical polishing process, amplitude of ultrasonic wave may be changed continuously or step by step. Moreover, during the chemical-mechanical polishing process, frequency of ultrasonic wave may be changed continuously or step by step. Furthermore, a plurality of ultrasonic waves may be applied simultaneously. In addition, the ultrasonic wave may be applied intermittently.

Meanwhile, a chemical-mechanical polishing apparatus of the present invention is characterized by providing a means for applying ultrasonic wave to a processing substrate in the chemical-mechanical polishing apparatus for flattening the surface of the processing substrate including level different areas. Any type of ultrasonic wave application means, if it can excite any one of platen or carrier of the chemical-mechanical polishing apparatus, may be used. As the ultrasonic wave application means described above, a well known piezoelectric type or electromagnetic type electric/acoustic transducer may also be used. The ultrasonic wave application means should preferably be provided with a means for controlling the means itself. The control means of the ultrasonic wave application means is necessary to control an input to the electric/acoustic transducer and such control means may be replaced with a computer in which the control program is previously inputted.

According to one aspect of the present invention, the ultrasonic wave is applied to a processing substrate during the chemical-mechanical polishing process. An energy taking part in the polishing of the conventional chemical-mechanical polishing process is, except for the chemical reaction, a relative moving velocity between the carrier and platen which are mutually rotating and a contact pressure between the processing substrate and pad. In the present invention, ultrasonic wave vibration is applied as a new polishing energy source, in addition to such conventional polishing mechanism. Thereby, the polishing rate can be raised without forcibly increasing relative velocity and contact pressure.

Moreover, slurry can efficiently be supplied to a fine clearance between the processing substrate and pad by applying the ultrasonic wave vibration during the polishing process. Thereby, uniform and good flat surface not depending on the pattern can be obtained because the influence of area and density of the projected areas on the substrate surface is rather small.

In addition, uniform polishing effect can be obtained through employment of a structure for changing the vibration mode given to the processing substrate to avoid influence of the standing wave by changing step by step or continuously the amplitude and vibration of the ultrasonic wave vibration during the polishing process. Here, it is also possible to selectively change amplitude of the ultrasonic wave applied in the bulk polishing process ensuring higher polishing rate in the initial or intermediate period of the polishing process and the micro-polishing process where the shape of polished surface in the final stage of the polishing process is given the priority.

When the ultrasonic wave is intermittently applied during the polishing process, the slurry used for polishing during application of the ultrasonic wave is exhausted from fine clearance between the processing substrate and pad and is then replaced with the new slurry. Thereby, polishing is always performed using fresh slurry, dependence on pattern and micro-loading effect can be controlled and more precise chemical-mechanical polishing can be realized.

According to another aspect of the present invention, an ultrasonic wave application means and a means for controlling this ultrasonic wave application means are provided in the chemical-mechanical polishing apparatus. Improvement of polishing rate and uniformity of polishing can be attained by loading the ultrasonic wave application means to the platen on which the carrier or pad of the processing substrate is also provided so that the ultrasonic wave can be applied in the highest efficiency to the processing substrate. Moreover, uniform chemical-mechanical polishing can always be performed under the optimum ultrasonic wave application condition by previously inputting the optimum ultrasonic wave application program depending on the kind of the processing substrate to the control means of the ultrasonic wave application means.

BRIEF DESCRIPTION OF THE DRAWINGS

Other objects and advantages of the present invention will be apparent from the following detailed description of the presently preferred embodiments thereof, which description should be considered in conjunction with the accompanying drawings in which:

FIGS. 1A and 1B are schematic cross-sectional views for explaining a chemical-mechanical polishing method of the present invention wherein FIG. 1A illustrates the condition that level different areas are generated on an interlayer insulating film formed on a plurality of wiring layers, while FIG. 1B illustrates the condition that the interlayer insulating film is flattened;

FIGS. 3A to 3D are schematic cross-sectional views for explaining the conventional chemical-mechanical polishing method wherein FIG. 3A illustrates the condition that level different areas are generated on the interlayer insulating film formed on a plurality of wiring layers, while FIG. 3B illustrates the condition that resist patterns are formed on the recessed areas on the interlayer insulating film, FIG. 3C illustrates the condition that the projected areas of the interlayer insulating film are removed by the etching process using the resist patterns as a mask and FIG. 3D illustrates the condition that the interlayer insulating film is flattened by the chemical-mechanical polishing process.

DESCRIPTION OF THE PREFERRED EMBODIMENTS

The preferred embodiments of the present invention will be explained with reference to the accompanying drawings.

First, a chemical-mechanical polishing apparatus of the present invention will be explained prior to the explanation about the actual polishing process.

Figure 2:
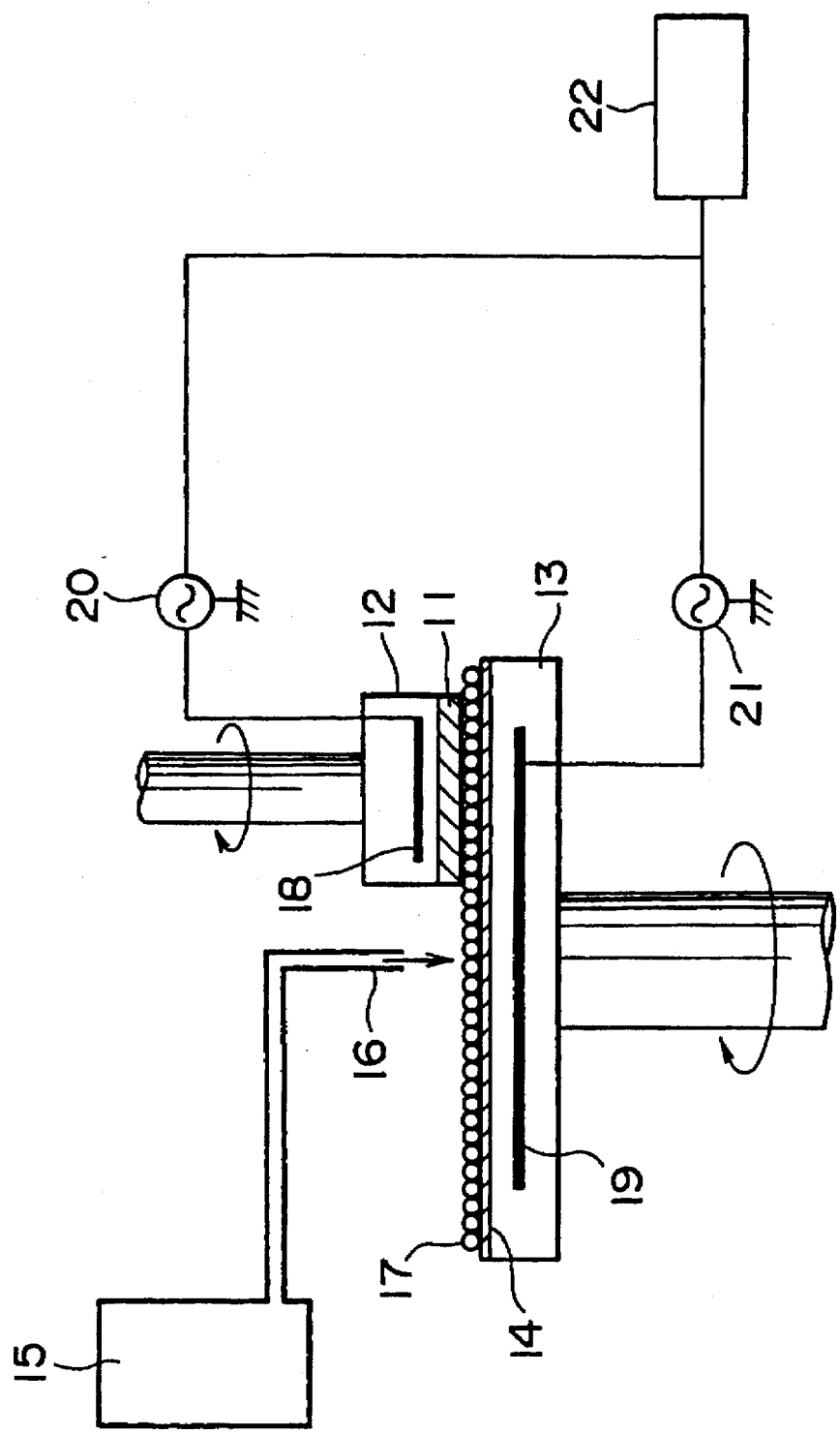
FIG. 2 is a schematic cross-sectional view illustrating a chemical-mechanical polishing apparatus of the present invention.
Figure 3A:
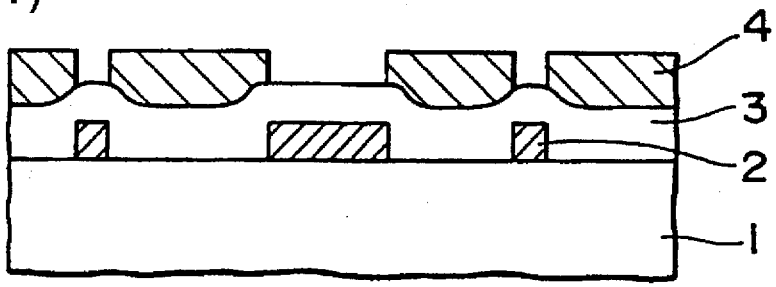
Figure 3B:
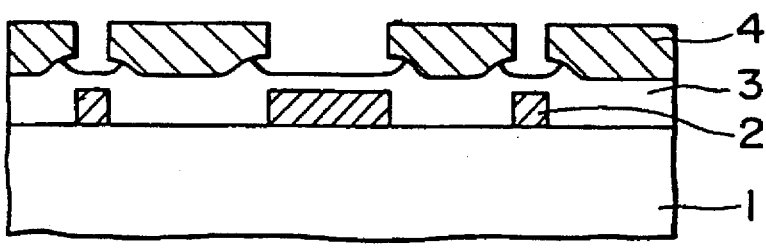
Figure 3C:
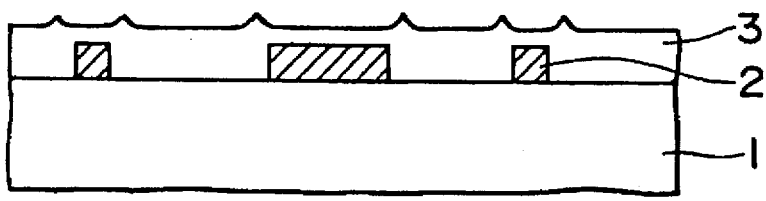
Figure 3D:
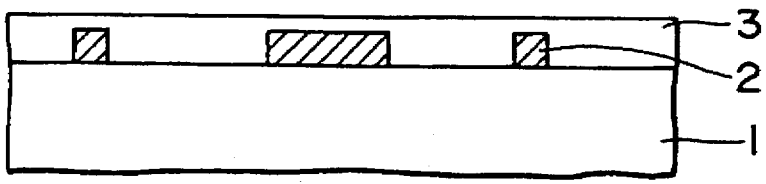
Figure 4:
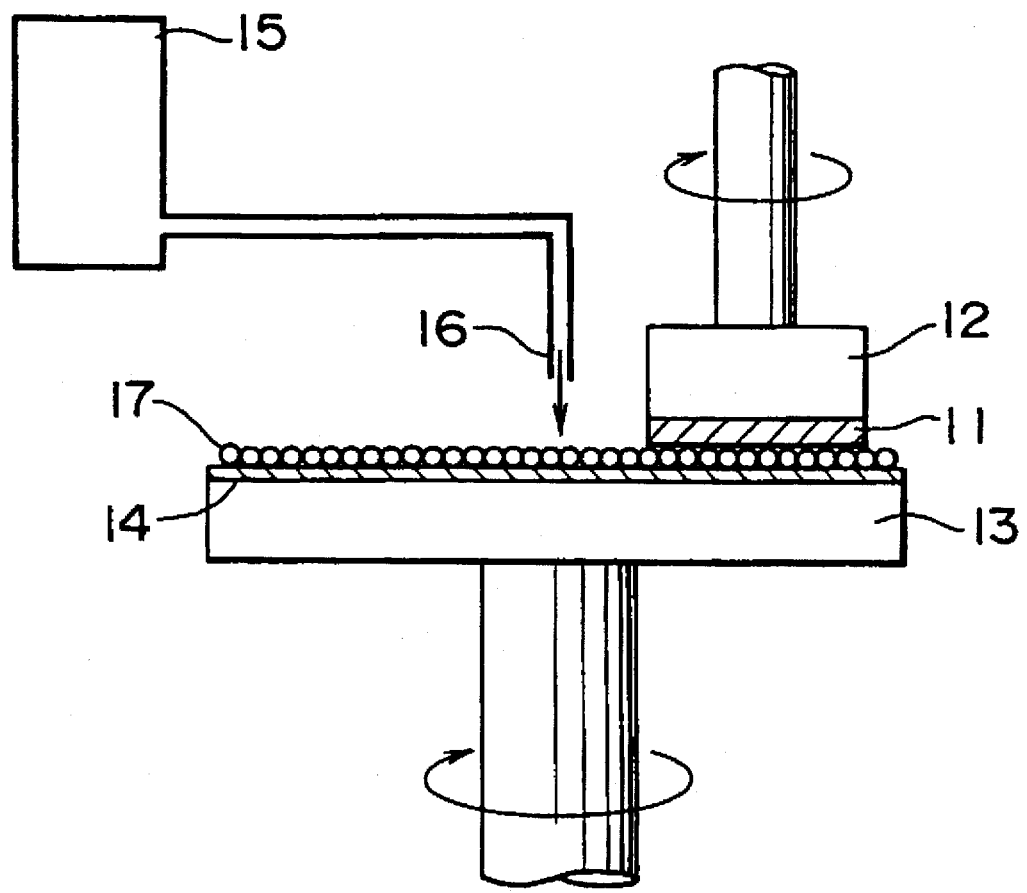
FIG. 4 is a schematic cross-sectional view illustrating the conventional chemical-mechanical polishing apparatus.

FIG. 2 is a schematic cross-sectional view illustrating an example of structure of a chemical-mechanical polishing apparatus of the present invention. Since the basic structure is similar to the conventional chemical-mechanical polishing apparatus shown in FIG. 4, the repeated explanation is omitted here. The chemical-mechanical polishing apparatus of the present invention is characterized in adding a first ultrasonic wave vibration applying means transmitter 18 for exciting a carrier 12 on which the processing substrate is bonded, a first ultrasonic wave oscillator 20 for driving the first ultrasonic wave vibration applying means, a second ultrasonic wave vibration applying means transmitter 19 for exciting a platen 13 as a polishing plate and a second ultrasonic wave oscillator 21 for driving the second ultrasonic wave vibration applying means. The chemical-mechanical polishing apparatus of the present invention is also characterized in addition of a control means 22 of the ultrasonic wave vibration applying means to the stage preceding the first ultrasonic wave oscillator 20 and the second ultrasonic wave oscillator. A control means 22 of the ultrasonic wave vibration applying means can individually or simultaneously control the first ultrasonic wave oscillator 20 and the second ultrasonic wave oscillator 21.

The control means 22 of the ultrasonic wave vibration applying means can freely control output levels, output frequencies and output waveforms of the first ultrasonic wave oscillator 20 and second ultrasonic wave oscillator 21. As the output waveform, the sine wave is generally selected, but the waveform can be selected freely from other waveforms such as rectangular wave and sawtooth wave, etc. depending on purposes. Regarding the process factors such as output level, output frequency and output waveform, etc., it is preferential that the optimum condition is previously obtained by experiments for each processing substrate and this data is inputted to the control means 22 of the ultrasonic wave vibration applying means to control the actual process based on this input data. In addition, automatic control of the process as a whole can be achieved by previously inputting, to the control apparatus, the optimum values of the other factors, for example, the number of rotations of carrier 12 and platen 13, contact pressure between the processing substrate 11 and pad 14, pH value of slurry 17, concentration and temperature conditions.

Embodiment 1:

In this embodiment, the present invention is applied for flattening of interlayer insulating film formed on an aluminum-based metal wirings. This embodiment will be explained with reference to FIGS. 1A and 1B. The structural elements having the functions like that of FIGS. 3A to 3D utilized for explanation about the conventional chemical-mechanical polishing method are designated with the like reference numerals.

First, as shown in FIG. 1A, the first interlayer insulating film 1 such as $SiO_2$, etc. and the wiring layer 2 consisting of the aluminum-based metal, etc. are formed on a semiconductor substrate (not illustrated) of Si, etc. Pattern density and wiring width of the wiring layer 2 are distributed. The coarse line and space of the wiring layer 2 is, for example, 0.35 μm, while the fine line and space thereof is 2.0 μm. Height of the wiring layers is uniformly set to 0.5 μm. Next, the second interlayer insulating film 3 is formed thick, for example, in the thickness of 0.8 μm at the flat area. A sample having completed the processings explained above is prepared as the processing substrate.

Next, using the chemical-mechanical polishing apparatus shown in FIG. 2, the processing substrate 11 explained above is adhered in the downward direction to the carrier 12 using a wax, etc. and chemical-mechanical polishing has been conducted for the second interlayer insulating film 3 under the following conditions, as an example, while the platen 13 is being excited. As the slurry, an ordinary one which has been obtained by suspending fine particles of silica into the KOH/alcohol/water-based solvent has been used.

| | |
|---|---|
| Number of rotations of platen: | 50 rpm |
| Number of rotations of carrier: | 17 rpm |
| Polishing pressure: | 8 psi |
| Pad temperature: | 30 to 40° C. |
| Flow rate of slurry: | 225 ml/min. |
| Ultrasonic wave output: (second ultrasonic wave oscillator output) | 300 W |
| Ultrasonic wave frequency: (second ultrasonic wave oscillator frequency) | 40 kHz |

As a result, as shown in FIG. 1B, the second interlayer insulating film 3 is flattened by the chemical-mechanical polishing method and apparatus. The polishing rate is two times that of the conventional method where the ultrasonic wave is not applied, dependence on pattern density of the under wiring layer 2 is almost not measured and uniformly flat surface has been obtained. Polishing of the second interlayer insulating film has been completed on the wiring layer leaving, for example, the thickness of about 0.2 μm and the upper wiring layer can be formed by further depositing the insulating film, as required, by the plasma CVD and reduced pressure CVD method, etc. According to this embodiment, excellent result has been obtained in both polishing rate and flatness of the polished surface by exciting the second ultrasonic wave vibration applying means comprised in the platen, in addition to the conventional chemical-mechanical polishing method.

Embodiment 2:

In the embodiment 1, the ultrasonic wave vibration has been applied continuously to the platen 13, but in this embodiment 2, the processing substrate and other polishing conditions are kept identical to those of the embodiment 1, but the ultrasonic wave vibration has been applied intermittently. As an example, when the ultrasonic wave vibration has been applied to the platen 13 in the cycle of ON state for 10 seconds and OFF state for 10 seconds, the polishing rate has been about 1.5 times that of the conventional method where the ultrasonic wave is not applied, dependence on the pattern density of the lower wiring layer 2 is not almost measured and extremely uniform and flat surface has been obtained.

Embodiment 3:

In this embodiment, the ultrasonic wave vibration has been applied to the carrier 12, using the processing substrate and chemical-mechanical polishing apparatus same as those in the preceding embodiment. The same explanation about the preceding embodiments are not repeated and only an example of the polishing conditions is described hereunder.

| | |
|---|---|
| Number of rotations of platen: | 50 rpm |
| Number of rotations of carrier: | 17 rpm |
| Polishing pressure: | 8 psi |
| Pad temperature: | 30 to 40° C. |
| Flow rate of slurry: | 225 ml/min. |

-continued

| | |
|---|---|
| Ultrasonic wave output: (first ultrasonic wave oscillator output) | 300 W |
| Ultrasonic wave frequency: (first ultrasonic wave oscillator frequency) | 50 kHz |

As a result, as shown in FIG. 1(b), the second interlayer insulating film 3 has been flattened by the chemical-mechanical polishing method. The polishing rate has been about 2.5 times that of the conventional method where the ultrasonic wave is not applied, dependence on pattern density of the under wiring layer 2 is almost not measured and uniformly flat surface has been obtained. The polishing of the second interlayer insulating film has been completed leaving the thickness of 0.2 μm on the wiring layer and the upper layer wiring is formed by further depositing an insulating film, as required, by the reduced pressure CVD method, etc. According to the present embodiment, excellent result has been obtained in both polishing rate and flatness of the polished surface by exciting the first ultrasonic wave vibration applying means comprised in the platen, in addition to the conventional chemical-mechanical polishing method. Moreover, in this embodiment, since the processing substrate has been excited with the first ultrasonic wave vibration applying means truly near the processing substrate, effect of application of the ultrasonic wave vibration can further be improved.

Embodiment 4:

In the embodiment 3, the ultrasonic wave vibration has been applied continuously to the carrier 12, but in this embodiment, the processing substrate and the other polishing conditions are kept identical to those of the embodiment 3 and the ultrasonic wave vibration is applied intermittently to the carrier 12. As an example, when the ultrasonic wave vibration is applied to the carrier 12 in the cycle of ON condition for 10 seconds and OFF condition for 10 seconds, the polishing rate has been about 2.0 times that of the conventional method where the ultrasonic wave is not applied, but dependence on pattern density of the under wiring layer 2 is not almost measured and uniformly flat surface has been obtained.

Embodiment 5:

In this embodiment, the ultrasonic wave vibration is applied to both carrier 12 and platen 13 using the processing substrate and chemical-mechanical polishing apparatus which are same as those used in the preceding embodiment. The same explanation about the preceding embodiments are not repeated and only an example of the polishing conditions is described hereunder.

| | |
|---|---|
| Number of rotations of platen: | 50 rpm |
| Number of rotations of carrier: | 17 rpm |
| Polishing pressure: | 8 psi |
| Pad temperature: | 30 to 40° C. |
| Flow rate of slurry: | 225 ml/min. |
| Ultrasonic wave output: (first ultrasonic wave oscillator output) | 150 W |
| Ultrasonic wave frequency: (first ultrasonic wave oscillator frequency) | 50 kHz |
| Ultrasonic wave output: (second ultrasonic wave oscillator output) | 200 W |
| Ultrasonic wave frequency: (second ultrasonic wave oscillator frequency) | 40 kHz |

As a result, as shown in FIG. 1B, the second interlayer insulating film 3 has been flattened by the chemical-mechanical polishing method. The polishing rate has been about 3.0 times that of the conventional method where the ultrasonic wave is not applied, dependence on pattern density of the under wiring layer 2 is almost not measured and uniformly flat surface has been obtained. Polishing of the second interlayer insulating film has been completed leaving the thickness of 0.2 μm on the wiring layer and the upper wiring layer can be formed by further deposition of the insulating film, as required, by the reduced pressure CVD method. According to this embodiment, excellent result has been obtained for both polishing rate and flatness of the polished surface by exciting the first ultrasonic wave vibration applying means comprised in the carrier 13, in addition to the conventional chemical-mechanical polishing method. Moreover, according to this embodiment, more effective polishing than that of the preceding embodiments can be realized by exciting both carrier 12 and platen 13.

Although the present invention has been explained above by referring to five preferred embodiments, the present invention is not limited thereto.

Rectangular wave, sawtooth wave or a composite wave of these waveforms may be used, as well as sine wave, as the ultrasonic wave. Basically, the ultrasonic wave of several tens kHz to several hundreds kHz is employed as the frequency to be applied, but the audible band of 20 kHz or less and megatonic band of MHz order may also be used. Moreover, it is also allowed to superimpose a plurality of frequencies and excitation by white noise or pink noise is also possible.

In the structure of the ultrasonic wave vibration applying means employed, any one of the carrier or platen is excited or both of them are excited simultaneously, but it is also possible to excite the rotating shaft of the carrier or platen. Basically, polishing rate can be improved by providing the ultrasonic wave vibration applying means near the processing substrate in view of reducing attenuation of vibration.

In above embodiments, an interlayer insulating film consisting of $SiO_2$ of a semiconductor device as the processing substrate has been flattened but a silicate glass such as PSG, BSG, BPSG, AsSG and an insulating film such as SiON, $Si_3N_4$ may also be flattened. Moreover, the present invention can also be applied for element isolation and flattening of the insulating material or dielectric material buried in the trench forming a capacitor cell of DRAM. In addition, the present invention can also be applied to flattening of a high melting point metal layer of tungsten W after it is formed by the CVD method and of an aluminum-based metal layer after it is formed. The chemical-mechanical polishing apparatus of the present invention can also be used for mirror-polishing of a semiconductor substrate not accompanied by chemical reactions.

As the slurry, an example obtained by combining fine particles of silica and KOH/ethanol/water-based solvent has been used, but the other fine particles for polishing such as $Al_2O_3$ and the solvent of the other group may be selected depending on the processing substrate. For example, for the flattening of tungsten W, the solvent of $H_2O_2$/KOH system is suitable, while for the flattening of aluminum-based metal layer, the solvent of $H_3PO_4/H_2O_2$ system may be used.

As will be apparent from above description, according to the present invention, the polishing rate can be improved by 1.5 times that of the conventional chemical-mechanical polishing method by applying the ultrasonic wave vibration to a processing substrate during the chemical-mechanical polishing process by the present invention. Since this effect can be realized without forcibly increasing the number of rotations and polishing pressure of the carrier and platen, less amount of damage is applied on the processing substrate.

Moreover, ununiformity of polishing rate depending on fine or coarse density or area size of the pattern to be flattened at the surface of processing substrate can be eliminated and extremely uniform and flat surface can be obtained.

The chemical-mechanical polishing method which provides uniform and higher throughput described above can be attained by employing a chemical-mechanical polishing apparatus where the ultrasonic wave vibration applying means is added to the carrier which is a supporting member of the processing substrate and the platen which is a polishing plate. In addition, since composition of the slurry is not required to be changed, the excellent effect can be obtained rather easily.

With the effect described above, improvements in throughput and uniformity of the process for flattening the surface of a semiconductor device where level different areas are generated by employment of the multilayer wiring structure can be realized and the present invention is capable of giving much contribution to the manufacturing process of highly integrated semiconductor devices.

What is claimed is:

1. An apparatus for simultaneously chemically, mechanically and ultrasonically polishing a surface of a semiconductor wafer, the apparatus comprising:

a rotatable carrier with a downwardly facing surface, the semiconductor wafer to be polished being bonded to the downwardly facing surface of the carrier, the carrier further comprising a first ultrasonic transmitter for transmitting ultrasonic wave energy through the carrier to the wafer, the first transmitter being connected to a first oscillator for driving the first transmitter, a rotatable platen with an upwardly facing surface, a polishing pad being bonded to the upwardly facing surface of the platen, the platen further comprising a second ultrasonic transmitter for transmitting ultrasonic wave energy through the platen, through the pad and to the wafer, the second transmitter being connected to a second oscillator for driving the second transmitter, a port for supplying polishing slurry to the pad, at least one of the platen or the carrier being vertically positionable so that the pad and slurry disposed on the pad engages the wafer with a pressure, a controller for simultaneously activating the first and second oscillators for a simultaneous transmission of ultrasonic wave energy through the carrier and through the platen.

2. The apparatus of claim 1 wherein the controller is capable of changing the amplitude and the frequency of the ultrasonic wave energy being transmitted from the first and second transmitters.

3. The apparatus of claim 1 wherein the first transmitter is disposed within the carrier and above the wafer.

4. The apparatus of claim 1 wherein the second transmitter is disposed within the platen and below the pad.

5. A method for simultaneously chemically, mechanically and ultrasonically polishing a surface of a semiconductor wafer, the method comprising the following steps:

providing a rotatable carrier with a downwardly facing surface, the carrier comprising a first ultrasonic transmitter for transmitting ultrasonic wave energy through the carrier to the wafer, the transmitter being connected to a first oscillator for driving the first transmitter, providing a rotatable platen with an upwardly facing surface, a polishing pad being bonded to the upwardly facing surface of the platen, the platen comprising a second ultrasonic transmitter for transmitting ultrasonic wave energy through the platen, through the pad and to the wafer, the second transmitter being connected to a second oscillator for driving the second transmitter, providing a port for supplying polishing slurry to the pad, bonding the semiconductor wafer to be polished to the downwardly facing surface of the carrier, pumping slurry through the port to the pad, vertically positioning the platen or the carrier so that the pad and slurry disposed on the pad engages the wafer with a predetermined pressure, rotating the platen and the carrier, simultaneously transmitting ultrasonic wave energy from the first and second transmitters.

6. The method of claim 5 wherein the first transmitter is disposed within the carrier and above the wafer.

7. The method of claim 5 wherein the second transmitter is disposed within the platen an below the pad.

8. The method of claim 5 further comprising the step of varying the amplitudes of the ultrasonic wave energy being transmitted from the first and second transmitters.

9. The method of claim 5 further comprising the step of varying the frequencies of the ultrasonic wave energy being transmitted from the first and second transmitters.

10. The method of claim 5 further comprising the step of intermittently varying the amplitudes of the ultrasonic wave energy being transmitted from the first and second transmitters.

11. The method of claim 5 further comprising the step of intermittently varying the frequencies of the ultrasonic wave energy being transmitted from the first and second transmitters.

* * * * *